US010289009B2

(12) United States Patent
Van Hoof et al.

(10) Patent No.: US 10,289,009 B2
(45) Date of Patent: May 14, 2019

(54) LITHOGRAPHIC APPARATUS, CONTROL METHOD AND COMPUTER PROGRAM PRODUCT

(71) Applicant: ASML Netherlands B.V., Veldhoven (NL)

(72) Inventors: Bram Van Hoof, Wintelre (NL); Wim Tjibbo Tel, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/736,142

(22) PCT Filed: Jun. 2, 2016

(86) PCT No.: PCT/EP2016/062498
§ 371 (c)(1),
(2) Date: Dec. 13, 2017

(87) PCT Pub. No.: WO2017/005419
PCT Pub. Date: Jan. 12, 2017

(65) Prior Publication Data
US 2018/0181011 A1 Jun. 28, 2018

(30) Foreign Application Priority Data
Jul. 3, 2015 (EP) .................... 15175164

(51) Int. Cl.
G03F 7/20 (2006.01)
G03F 9/00 (2006.01)

(52) U.S. Cl.
CPC .......... *G03F 7/70633* (2013.01); *G03F 7/705* (2013.01); *G03F 7/70525* (2013.01);
(Continued)

(58) Field of Classification Search
CPC .... G03F 7/20; G03F 7/70358; G03F 7/70633; G03F 7/70525
(Continued)

(56) References Cited

U.S. PATENT DOCUMENTS 5,748,323 A    5/1998 Levinson
6,118,515 A *  9/2000 Wakamoto .......... G03F 7/70358
                                                355/53
(Continued)

FOREIGN PATENT DOCUMENTS

EP    1457828      9/2004
JP    06-112105    4/1994
(Continued)

OTHER PUBLICATIONS

International Preliminary Report on Patentability dated Jan. 9, 2018 in corresponding International Patent Application No. PCT/EP2016/062498.
(Continued)

Primary Examiner — Hung Nguyen
(74) Attorney, Agent, or Firm — Pillsbury Winthrop Shaw Pittman LLP

(57) ABSTRACT

A lithographic apparatus obtains a height map of a substrate and uses the height map when controlling imaging of the pattern to the substrate. The apparatus is arranged to disregard at least partially height anomalies when controlling the imaging. The height anomalies may be identified by processing the height map. For example, in some embodiments the height anomalies are identified using a shape recognition model. In some embodiments, a modified version of the height map is produced in which the height anomalies are at least partially removed, and the modified version of the
(Continued)

height map is used in controlling the imaging. An anomaly map may be used together with the (unmodified) height map to control imaging.

20 Claims, 7 Drawing Sheets

(52) U.S. Cl.
CPC .......... *G03F 9/7026* (2013.01); *G03F 9/7034* (2013.01); *G03F 9/7092* (2013.01)

(58) Field of Classification Search
USPC .............................................. 355/52, 53, 55
See application file for complete search history.

(56) References Cited

U.S. PATENT DOCUMENTS

| | | |
|---|---|---|
| 6,521,889 B1 | 2/2003 | Ina et al. |
| 6,650,399 B2 | 11/2003 | Baselmans et al. |
| 7,012,672 B2 | 3/2006 | Van Rhee et al. |
| 7,265,364 B2 | 9/2007 | Teunissen et al. |
| 8,619,235 B2 | 12/2013 | Van Drent |
| 8,842,293 B2 | 9/2014 | Den Boef et al. |
| 9,488,465 B2 | 11/2016 | Khuat Duy et al. |
| 9,632,435 B2 | 4/2017 | Ten Kate et al. |
| 2002/0145717 A1 | 10/2002 | Baselmans et al. |
| 2004/0239905 A1 | 12/2004 | Van Rhee et al. |
| 2005/0169515 A1 | 8/2005 | Kobayashi et al. |
| 2006/0114436 A1 | 6/2006 | Oesterholt et al. |
| 2008/0128642 A1 | 6/2008 | Mos et al. |
| 2008/0221817 A1 | 9/2008 | Swaringen et al. |
| 2009/0136121 A1 | 5/2009 | Nakagaki et al. |
| 2010/0110401 A1 | 5/2010 | Chung |
| 2010/0233600 A1 | 9/2010 | Den Boef et al. |
| 2013/0050670 A1 | 2/2013 | Koenen et al. |
| 2013/0128247 A1* | 5/2013 | Khuat Duy ........... G03F 9/7034 355/63 |
| 2013/0259358 A1 | 10/2013 | Chen et al. |
| 2014/0111779 A1 | 4/2014 | Chen et al. |
| 2015/0067617 A1 | 3/2015 | Chang et al. |

FOREIGN PATENT DOCUMENTS

| | | |
|---|---|---|
| JP | 07-86135 | 3/1995 |
| JP | 09-69485 | 3/1997 |
| JP | 2001-291658 | 10/2001 |
| JP | 2004343060 | 12/2004 |
| JP | 2006157014 | 6/2006 |
| JP | 2007-266378 | 10/2007 |
| JP | 2008147654 | 6/2008 |
| JP | 2009123851 | 6/2009 |
| JP | 2010502024 | 1/2010 |
| JP | 2010512001 | 4/2010 |
| JP | 2013079939 | 5/2013 |
| JP | 2013084937 | 5/2013 |
| JP | 2013110398 | 6/2013 |
| TW | 201135375 | 10/2011 |
| TW | 201502719 | 1/2015 |
| WO | 2014/127985 | 8/2014 |

OTHER PUBLICATIONS

International Search Report and Written Opinion dated Oct. 19, 2016 in corresponding International Patent Application No. PCT/EP2016/062498.

Japanese Office Action issued in corresponding Japanese Patent Application No. 2017-564589, dated Jan. 28, 2019.

* cited by examiner

LITHOGRAPHIC APPARATUS, CONTROL METHOD AND COMPUTER PROGRAM PRODUCT

CROSS REFERENCE TO RELATED APPLICATIONS

This application is the U.S. national phase entry of PCT patent application No. PCT/EP2016/062498, which was filed on Jun. 2, 2016, which claims the benefit of priority of European patent application No. 15175164.1, which was filed on Jul. 3, 2015, and which is incorporated herein in its entirety by reference.

BACKGROUND

Field of the Invention

The present disclosure relates to lithographic apparatus. The disclosure relates in particular to the control of lithographic apparatus using height maps. The disclosure further relates to methods of manufacturing devices by lithography, and to data processing apparatuses and computer program products for implementing parts of such apparatus and methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

The pattern is imaged onto the target portion of the substrate using a lenses (or mirrors) forming a projection system. When imaging the pattern onto the substrate it is desirable to ensure that an uppermost surface of the substrate (i.e. the surface onto which the pattern is to be imaged) lies within the focal plane of the projection system.

The surface of a substrate on which a pattern should be projected is never perfectly flat, but presents many height deviations on both a large scale and smaller scale. Failure to adjust the focus of the projection system may result in poor patterning performance and consequently poor performance of the manufacturing process as a whole. Performance parameters such as overlay, critical dimension (CD) and CD uniformity in particular will be degraded by poor focus.

To measure these height deviations, level sensors are normally integrated in the lithographic apparatus. These are optical sensors used to measure the vertical position of the uppermost surface of the substrate at points all across the substrate, after it has been loaded into the lithographic apparatus. This set of measurements is stored in some suitable form and may be referred to as a "height map". The height map is then used when controlling imaging of the pattern onto the substrate, to ensure that the radiation sensitive resist layer on each portion of the substrate lies in the focal plane of the projection lens. Typically the height of a substrate support bearing the substrate will be adjusted continuously during exposure of successive portions on a substrate. Examples of level sensors are disclosed in U.S. Pat. No. 7,265,364 B2, US 20100233600 A1 and US 2013128247 A. They do not need to be described in detail herein.

A known problem in lithography is that the substrate support and/or the substrate itself may become contaminated with microscopic particles which cause highly localized deviations in height. These deviations become represented in the height map that is used for control of the imaging operation. So-called "focus spots" can thus occur, where the normal control algorithms of the imaging operation may be unable to achieve the best focus, resulting in poor image quality, and poor yield of functional devices. In EP 1457828 A2, a processor is arranged to monitor for the occurrence of focus spots, by using the height map. In order to detect focus spots reliably, the processor first calculates an average die topography, and subtracts the average die topography from the measured height map, to facilitate the identification of focus spots. Using the resulting information, interventions can be planned to clean contamination from the lithographic apparatus and/or the affected substrate. Nevertheless, until such interventions are made, the performance of the manufacturing process is compromised. Those skilled in the art will appreciate that maintaining throughput is critically important in high volume manufacture, and a certain level of focus spots may have to be tolerated, for a time, at the penalty of reduced yield.

SUMMARY OF THE INVENTION

It is desirable to improve the yield of lithographic manufacturing processes, without adversely impacting throughput. It is further desirable that such improvement be obtained if possible using existing lithographic apparatus and associated hardware.

The invention in a first aspect provides a lithographic apparatus for imaging a pattern onto a substrate using an optical projection system, the apparatus being arranged to obtain a height map representing a topographical variation across the substrate and to use the height map when controlling imaging of the pattern onto the substrate, wherein the apparatus is further arranged to disregard (ignore) at least partially one or more height anomalies represented in a localized region of the height map when controlling the imaging.

A height map, in this context, means any set of data points or parameters describing topographical variations across the surface of a substrate to which a pattern is to be applied. Typically the height map is expressed as an array of height values, each corresponding to a location on the substrate. However, the topographic variations (height variations) can be expressed in any suitable form. (It will be understood that "height" is used in the art to refer to variations of the surface position in a direction generally perpendicular to the plane of the substrate. Height does not refer to any particular direction relative to the surface of the earth or gravity.) Particularly in optical lithography, a height map is generally obtained by measurement of the substrate before exposure is performed. The height map may contain thousands of sample points in practice.

The height map is used to control actuators involved in imaging the pattern onto the substrate. In particular, focusing of an image correctly on the resist layer of a substrate is very closely controlled in accordance with the recorded height map.

In the context of the present disclosure, "height anomaly" refers to an anomalous height feature present on the substrate and represented in the height map. This includes for example surface features caused by contamination on the substrate back and/or front side. These height anomalies, or "focus spots", will be represented in the height map and may for example occupy a small region of sample points within the height map. The height anomalies can be identified by the disclosed apparatus using the height map prior to applying the pattern. The resulting information can be used to reduce the impact on yield, prior to any physical intervention. For the avoidance of doubt, "height anomaly" in the present disclosure does not relate for example to anomalous measurement signals, which do not accurately represent the surface height at all. Mechanisms to detect and correct anomalous measurement signals are known and disclosed for example in US 2013128247 A.

Embodiments of the invention can be arranged to use the height measurements to identify anomalies caused by contamination and to remove the effect of these in the focusing. The action of identifying anomalies can be performed using the height map itself. Alternatively, it could be performed using data in some other form, including raw measurement signals, or some processed version of the height map. It could be performed using measurements obtained separately. The function of disregarding (at least partially) height anomalies can be achieved by modifying the height map before it is used, or in some other way.

Embodiments of the invention can be arranged to disregard height values in the region of height anomaly completely, for example interpolating new height values from neighboring sample points. Alternatively, more sophisticated behaviors may be implemented. For example, height values in the height anomaly region can be used with reduced weighting, rather than disregarded completely. Alternatively, a model of the height anomaly can be calculated, and subtracted from the measured values in the region of the height anomaly.

In one embodiment, the invention provides a lithographic apparatus for imaging a pattern onto a substrate using an optical projection system, the apparatus including:
  a level sensor operable prior to applying said pattern for obtaining measurement signals related to a height of the substrate surface at many locations across the substrate;
  a processor for using said measurement signals to derive data representing a height map of the substrate; and
  a controller arranged to use said height map data to control focusing of said projection system when applying said pattern to the substrate at one or more target locations,
  wherein said processor and controller are further arranged to use the measurement signals directly or indirectly to identify height anomalies on the substrate surface, and to disregard at least partially the height anomalies when controlling focusing of the projection system.

The invention further provides a method of manufacturing a device, the device being formed in multiple layers on a substrate, the method to form a layer comprising applying a pattern onto the substrate, and subjecting the substrate to one or more chemical and/or physical processing steps to form device features in accordance with the applied pattern, wherein for at least one of said layers the step of applying the pattern comprises:
  obtaining a height map of the substrate; and
  using said height map to control imaging of the pattern to the substrate, while at least partially disregarding height anomalies.

The invention further provides a method of controlling imaging of a pattern on a substrate comprising the steps of:
  obtaining a height map of the substrate; and
  using said height map to control the imaging of the pattern to the substrate, while at least partially ignoring a height anomaly represented in the obtained height map.

In some embodiments, the height anomalies are identified by processing the height map. For example, in some embodiments the height anomalies are identified using a shape recognition model.

In some embodiments, a modified version of the height map is produced in which the height anomalies are at least partially removed, and the modified version of the height map is used in controlling said imaging. In other embodiments, anomaly map data is produced specifying locations of the identified height anomalies, and the anomaly map data together is used together with the height map to control imaging of the pattern on the substrate so as to reduce the influence of the height map at the specified locations.

The invention yet further provides a computer program product comprising machine-readable instructions for controlling a lithographic apparatus to implement the first aspect of the invention as set forth above.

The invention yet further provides a computer program product comprising machine-readable instructions for causing a lithographic apparatus to implement the method according to the invention as set forth above.

Such computer program products may for example take the form of instructions stored in a non-transient storage medium.

These and other aspects and advantages of the invention will be understood by the skilled reader from a consideration of the drawings and description of embodiments which follows.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
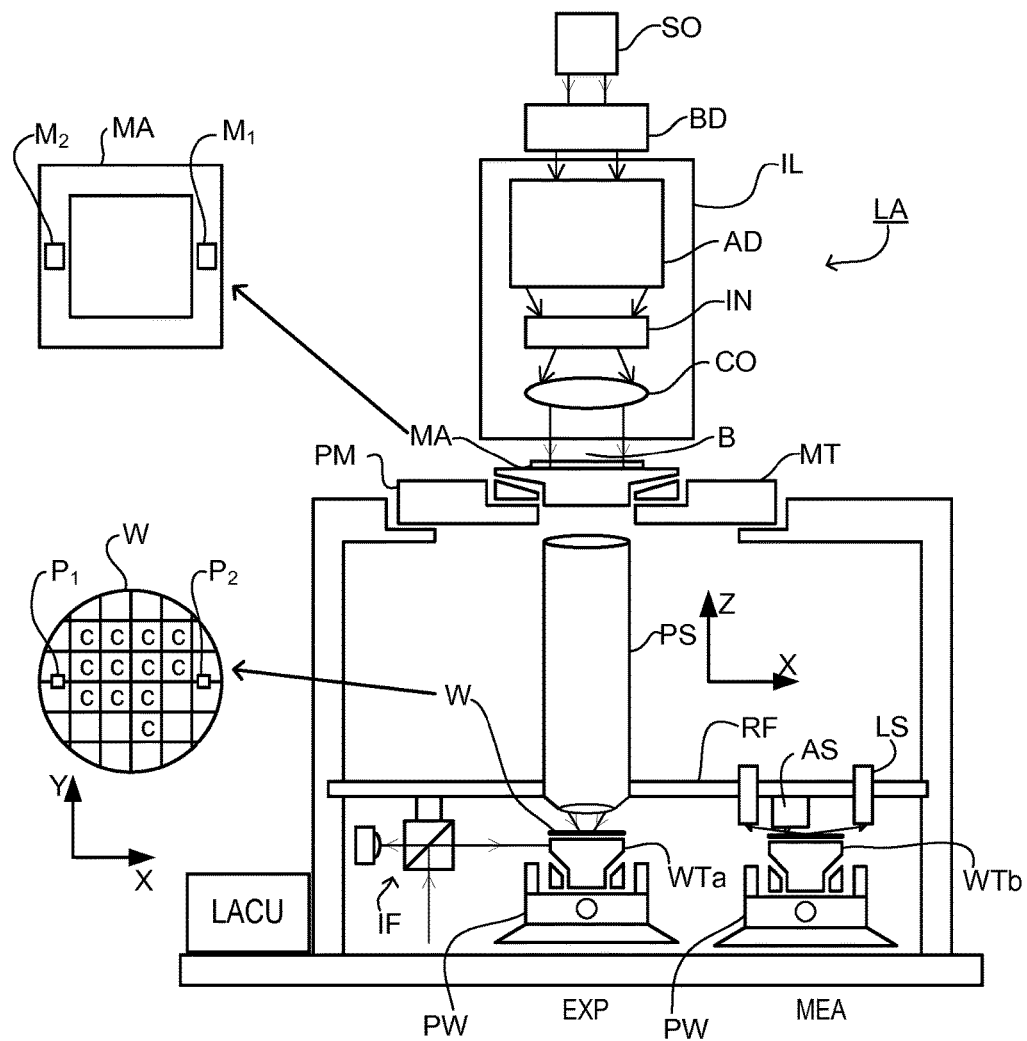
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography An example of a programmable mirror array employs a matrix arrangement of small mirrors, each of which can be individually tilted so as to reflect an incoming radiation beam in different directions The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned. Each target portion is commonly referred to as a "field", and contains one or more product dies in the finished product.

Combinations and/or variations on the above described modes of use or entirely different modes of use may also be employed.

Lithographic apparatus LA in this example is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. The preparatory steps may include mapping the surface height of the substrate using a level sensor LS and measuring the position of alignment markers on the substrate using an alignment sensor AS.

A lithographic apparatus control unit LACU controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these subsystem, with operators and with other apparatuses involved in the lithographic manufacturing process. Some data processing functions may be performed on processors external to the lithographic apparatus, using suitable communication links (not shown).

Figure 2:
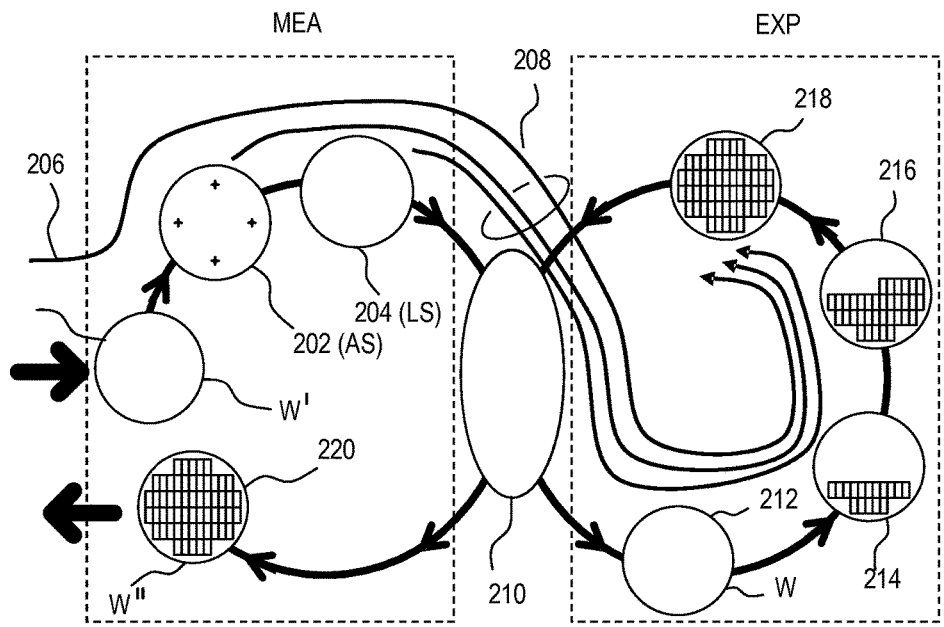
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station. For the purposes of this description, it is assumed that a substrate W has already been loaded into the exposure station. At step 200, a new substrate W' is loaded to the measurement station of the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving patterning performance, the task is to ensure that new patterns are applied with optimum focus on a substrate that has already been subjected to one or more cycles of patterning and processing. These processing steps progressively introduce distortions (local height deviations) in the substrate that are then measured and corrected for, to achieve satisfactory focus performance. Local height deviations are introduced also by deformation of the substrate caused when clamping it to the specific substrate table. These deformations are very slight, but significant when extremely high performance is required.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately positional deviations of marks across the substrate, including any distortion relative to a nominal rectangular grid.

At step 204, a map of wafer height (Z) against X-Y position is measured using the level sensor LS. The height map will be used to achieve accurate focusing of the exposed pattern. The height map may be expressed in different forms, but generally represents local deviations of the surface height from a nominal plane of the substrate. It will be understood that "height" in this context refers to position perpendicular to the plane of the substrate, and does not refer to the direction of Earth or gravity.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. As will be explained below, in the novel methods described herein, the recipe and measurement data may be modified and/or supplemented with prior knowledge affecting how the height map is to be used to control imaging of the pattern onto the substrate when height anomalies are identified at one or more regions across each substrate.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately imaged and accurately aligned with respect to the desired locations and with respect to features previously laid down on the same substrate. The exposed substrate, now labeled W" is unloaded from the apparatus at step 220, to undergo etching or other processes, in accordance with the exposed pattern.

Figure 3:
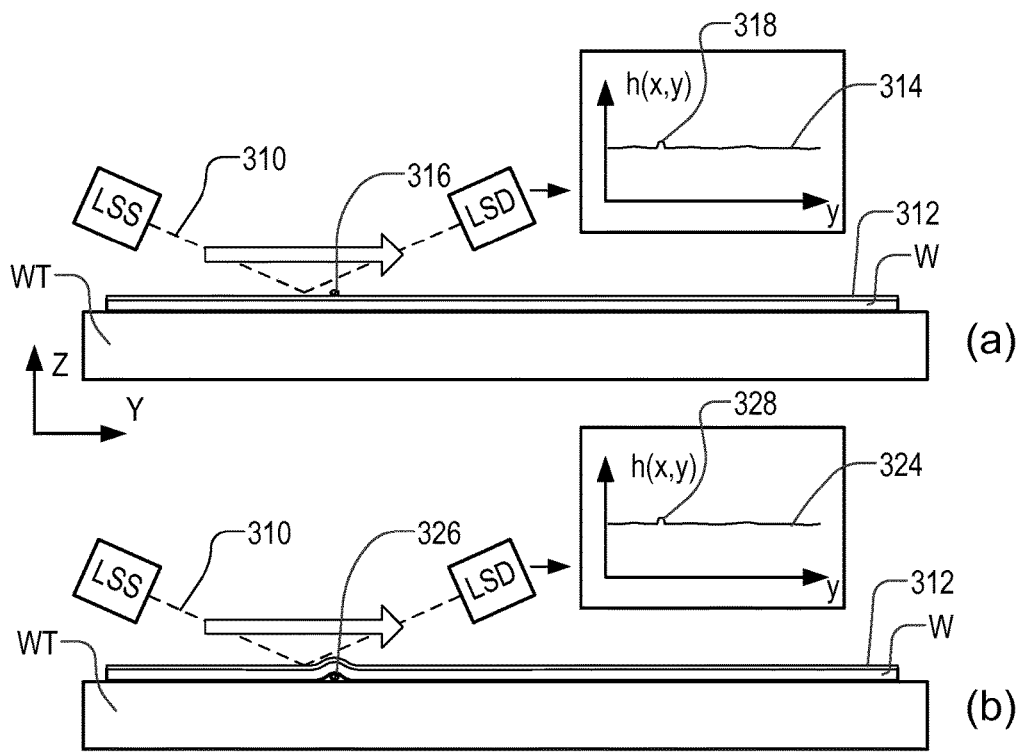
FIG. 3 depicts schematically the operation of an optical level sensor in side view (a) in the presence of contamination on a substrate and (b) in the presence of contamination beneath a substrate.

FIG. 3(a) illustrates schematically the operation of level sensor LS in an example of the lithographic apparatus LA. One of the substrate supports is labeled WT, and carries a substrate W. The level sensor LS is in this example an optical sensor, comprising a source side optics LSS, and detector optics LSD. In operation, source side optics LSS generates one or more beams of light 310 that impinge onto a substrate W. Substrate W typically has different layers formed on it, and typically many more layers than are illustrated here. A top layer will normally be the resist layer 312 in which a pattern is to be formed. Below that will be an anti-reflective coating and below that will be potentially many layers of device features formed in different layouts and materials.

The beam of light 310 is reflected by the substrate and detected by detector side optics LSD to obtain a signal S(x,y) from which a measurement of the surface height at a position (x,y) on the substrate can be derived. By measuring height at numerous positions across the substrate, a height map h(x,y) can be obtained by a suitable processor (not shown), and used in the exposure station to control focus and other parameters in the operation of the lithographic apparatus. The details of these optics for level sensing, as well as the associated signal processing, are known in the art and described for example in the prior publications mentioned in the introduction. They will not be described herein in detail. The radiation used in the present examples may be monochromatic, polychromatic and/or broadband. It may be P- or S-polarized, circularly polarized and/or unpolarized.

The height map h(x,y) can take any suitable form. In a simple embodiment, the height map comprises a two-dimensional array of sample values indexed by the X and Y coordinates of position across the substrate. In other embodiments, the height values could be expressed by parametric curves, fitted to measured sample values.

A graph 314 of h(x,y) in FIG. 3(a) represents height values in a single slice, for example extending in the Y direction with a certain X value. Most of the substrate surface, height variations are relatively gentle, both in extent and their degree of localization (spatial frequency). In the illustration, however, a particle of contamination 316 is present on the substrate surface. A height anomaly 318 is therefore present which can be recognized in the height map. From the point of view of controlling the imaging of patterns into the resist layer on the substrate, these height anomalies are regarded as undesirable "focus spots".

Similarly, in FIG. 3(b) a particle of contamination 326 is present beneath the substrate. This particle may have been present on the substrate support WT before the substrate was loaded. Alternatively, the particle may be something that has adhered to the backside of the substrate before it is loaded into the apparatus. In either case, the height map graph 324 reveals again a height anomaly 328.

FIG. 4(a) illustrates a portion of the height map using different levels of shading to represent height values on a X-Y plot. In other words, the image comprises a number of rectangular pixels, and the shade of each pixel represents the height deviation measured at a certain X, Y position. In the illustration, only a few levels of shading can be discriminated, due to the limitation of patent drawings. In a real example the height map can represent the contours of the surface much more finely. The portion of the height map within dashed outline 402 may represent the area of one target portion or field to which the pattern is to be applied by the lithographic apparatus LA. Over most of the field area, indicated as region A, height variations are relatively low and gentle. On the other hand, at region B, a height anomaly can be recognized because of the more extreme height variations that are confined within a small localized region.

Referring now to FIG. 5(a), we see in a schematic side view the influence of a height anomaly, e.g. contamination, on the formation of a correctly focused image in the resist layer 312. A dotted box 502 represents schematically the location of an aerial image of the patterning device MA. In a stepping type lithographic apparatus, the size of the aerial image 502 would correspond to the size of the entire field. In a scanning type of lithographic apparatus, the aerial image 502 corresponds to a narrow band or "slit" that scans across the area of the field as the patterning device and the substrate perform synchronized movements in relation to the projection system PS. A representation of this slit is the dotted box 404 in FIG. 4(b). The scanning motion is indicated by the broad white arrow in FIG. 4(b). Referring again to FIG. 5(a), it will be appreciated that the aerial image 502 shown in cross-section may be being viewed in the X-Z plane or in the Y-Z plane. In either case, the various subsystems of the lithographic apparatus control the imaging of the pattern onto the substrate so that the aerial image 502 lies as accurately as possible at the location 502', to imprint the image reliably in the resist layer 312.

Because the aerial image at any given time has a significant extent in each of the X and Y directions, the control of the positioning and orientation of the aerial image 502 is performed on the basis of a moving average of the height values represented in the height map at the location currently being imaged. In the case of a stepping method, a static average is produced. Any short-scale height anomalies can influence this average over a wide area, and so undermine the control of focusing in particular, and imaging in general.

Returning to FIG. 4(b), this is a plot of the focus height profile across the field during the scanning operation, when using conventional control techniques. For the upper part of the field (as seen in the diagram), the smooth height variations in region a cause no problem for the focus control function which has to average the height values across the slit 404. On the other hand, when scanning reaches the lower portion of the field, the height anomaly in region B causes the average focus height to rise across the entire slit 404. Consequently, in region C, a relatively large portion of the field deviates from the ideal focus.

At the left hand side of FIG. 5(a), we see the consequences of this, in the case of the contaminant particle 316 present on the substrate surface. When the height anomaly in a height map 402 is used for controlling the formation of the aerial image 502", the aerial image is positioned out of the plane of the resist layer 312. Poor focusing, and consequently poor formation of the pattern in the resist material, results in poor performance in applying the pattern to the resist in this region. This is represented by the region labeled NOK, in contrast to the normal performance location labeled OK and shown at the right hand side. FIG. 5(b) shows that similar consequences arise, when a contaminant particle 326 is located beneath the substrate W.

Figure 4:
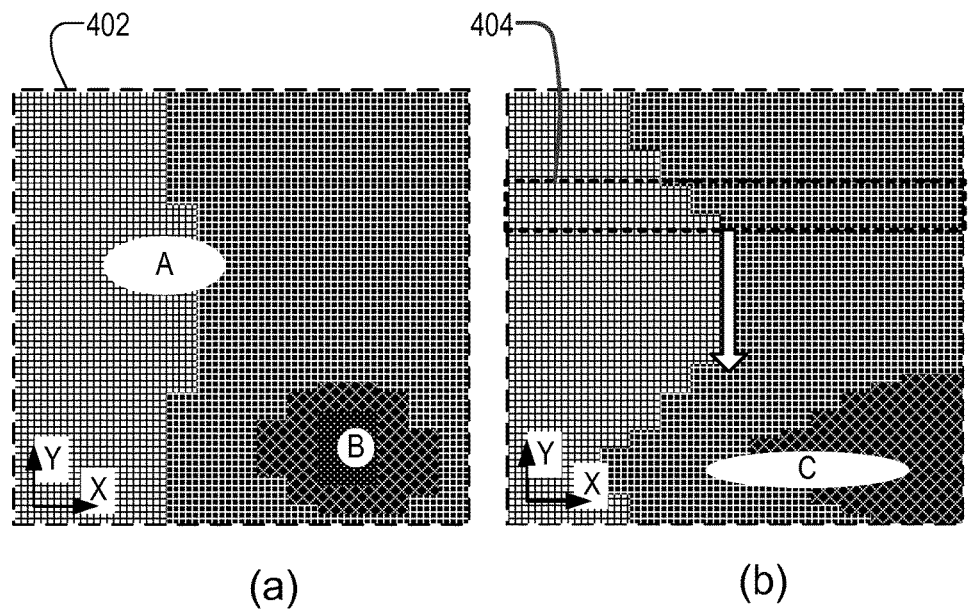
FIG. 4 illustrates schematically (a) a height map showing a height anomaly and (b) a resulting focus height profile in a lithographic apparatus operating according to the prior art.
Figure 5:
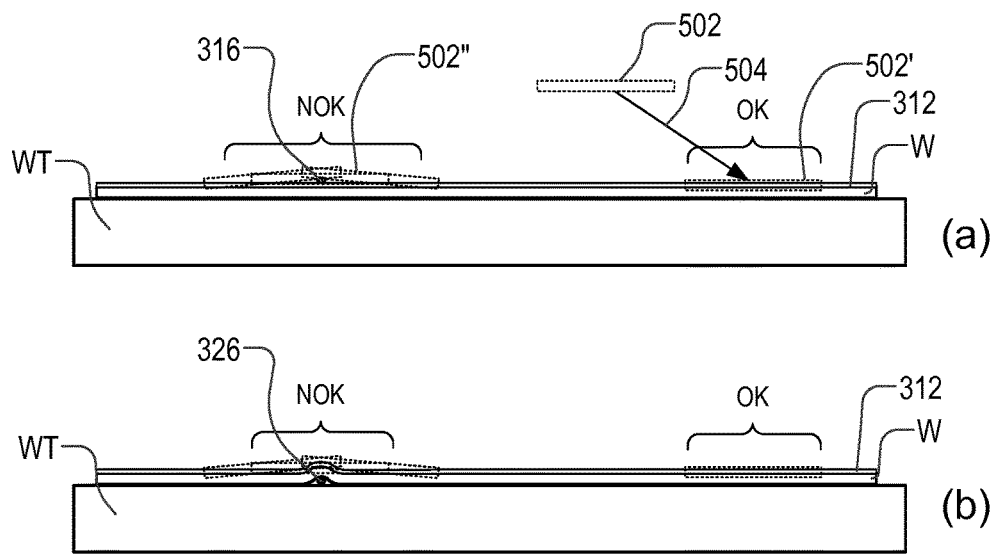
FIG. 5 illustrates in side view the influence of height anomalies on focusing performance in the apparatus according to the prior art, in the case of (a) contamination on the substrate and (b) contamination beneath the substrate.

FIGS. 4 and 5 thereby illustrate the loss of imaging performance, particularly focusing performance, that can result from height anomalies in conventional control methods. A modification of the control of a lithographic apparatus will now be described, as implemented for example in the apparatus of FIG. 1.

Figure 6:
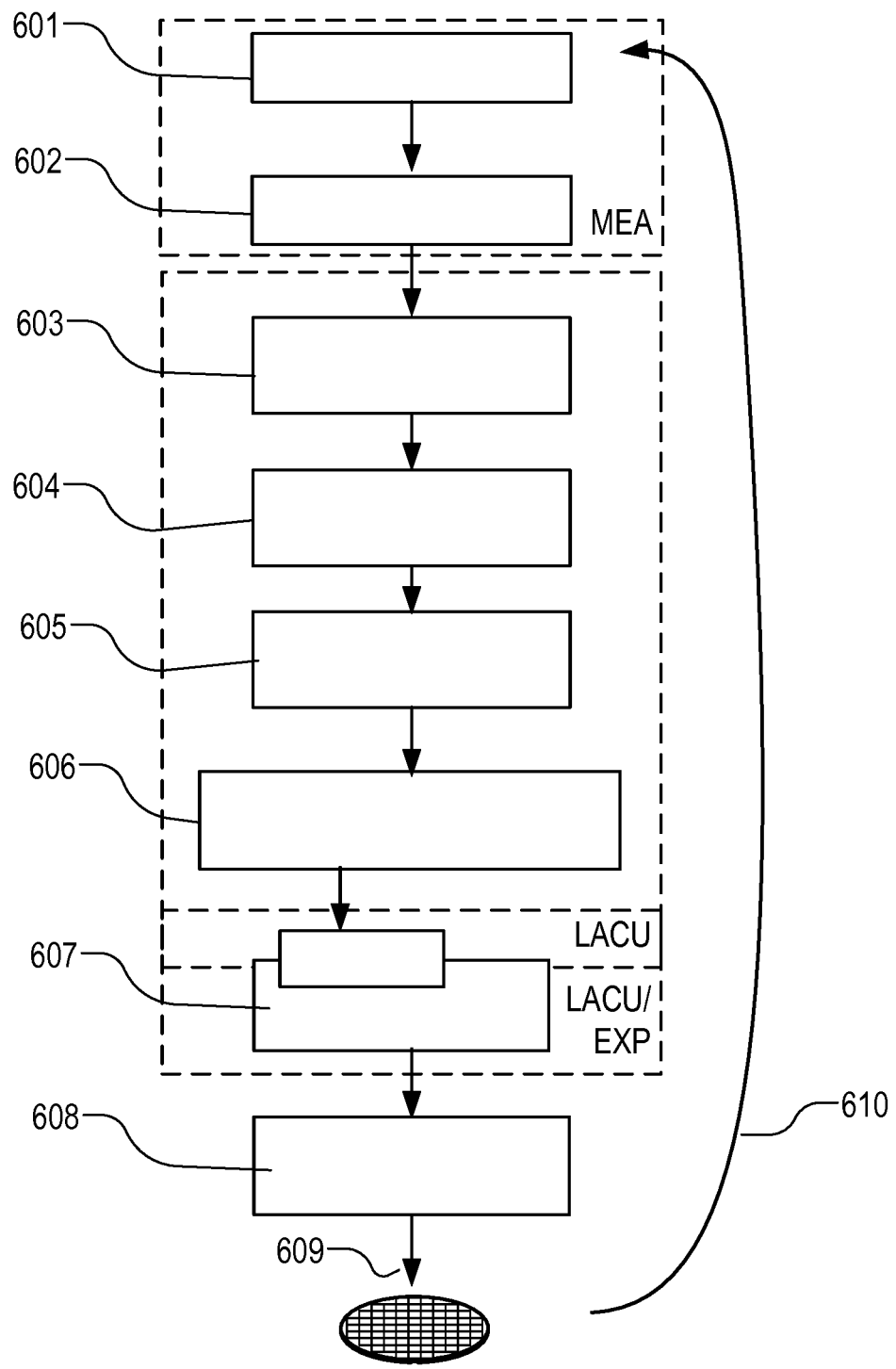
FIG. 6 is a flowchart of a method of manufacturing a device according to a first embodiment of the present invention.

FIG. 6 shows in schematic flowchart form a device manufacturing method according to an embodiment of the present disclosure. For example, a modified control program may be loaded into the lithographic apparatus control unit LACU in order to implement the steps that follow. Not illustrated in this figure are various off-line setup procedures that may be undertaken.

In the "online" manufacturing process, at 601 a substrate (for example a semiconductor wafer) is loaded into the measurement station MEA of the lithographic apparatus and at 602 the level sensor is used in the manner described in FIGS. 4(a) and (b) to obtain measurement signals S(x,y) related to a height of the substrate surface at many locations across the substrate. At 603 a processor (for example a main processor of the control unit LACU or a separate processor associated with the height mapping function) receives the measurement signals S(x,y).

At 604 the processor derives a height value for each point on the substrate by converting said measurement signals into local height values using a suitable algorithm. In this way, a height map is obtained, having a form similar to that shown in FIG. 4(a), but extending over the whole substrate. At this stage, anomalous signals caused, for example, by noise in the apparatus may be detected and eliminated, so that the height map accurately represents the physical features across the wafer.

At 605, the height map is examined to detect any height anomalies, also known as "focus spots" in the prior art. This step may be performed by spatial frequency filtering and/or pattern recognition in one or two dimensions. Simple examples will be illustrated below, with reference to FIGS. 10 and 11. Techniques known from EP 1457828 A2 can be applied, for example. The well-known MatLab® software provides an image processing toolbox with many alternative algorithms of shape recognition. By whatever means, the processor identifies regions of the height map, such as region B in FIG. 4(a), and identifies these as height anomalies that are to be disregarded in controlling the imaging process.

At step 606, in this example, a modified height map h'(x,y) is produced, in which the height anomalies have been removed and replaced with values derived from height values at positions neighboring and/or adjacent to the identified height anomaly region. The processor in other words disregards (ignores) or discounts height values from the identified height anomaly region(s) and performs an interpolation or extrapolation of height values over this region, based on measurements made in one or more neighboring regions.

At step 607, the modified height map h'(x,y) is 'delivered' to lithographic apparatus control unit LACU (or, if the processor performing the steps is already part of the control unit, the modified height map is delivered to the appropriate function for controlling exposure). The modified height map is used while the substrate is in the exposure station EXP, to control focusing of the projection system.

After the pattern has been applied to all fields on the substrate, at 608 the resist layer carrying the transferred pattern is developed and then subjected to whatever chemical and physical processes are required to form the device features in the underlying material. The process steps will vary depending on the application. After step 608, the device may be finished at step 609 or it may return to step 601 for patterning and processing further layers via step 610. For each repetition, the process may identify a different set of regions as height anomalies, and may apply the same or different algorithms and corrections to reduce the influence of those height anomalies on control of the exposure. For some layers, where focus is not critical, the apparatus may be controlled in a conventional way, without identifying height anomalies.

In a case where a particular region exhibits height anomaly each time the same substrate is loaded into the lithographic apparatus, it may be because that height anomaly is caused by contamination adhered to the back surface of the substrate. In another case, a height anomaly may appear at the same position on different substrates, indicating that contamination may be present on the substrate support. Information on height anomalies detected in step 605 may therefore be useful, when accumulated and analyzed statistically, for monitoring contamination levels and triggering (manually or automatically) interventions for maintenance and cleaning of the apparatus and/or the substrate.

Other implementations are possible, as already mentioned. Note that the function of identifying height anomalies can be implemented before, during or after the conversion from raw signal S to height values h. Modifying control of the imaging operation can also be achieved different ways.

Figure 7:
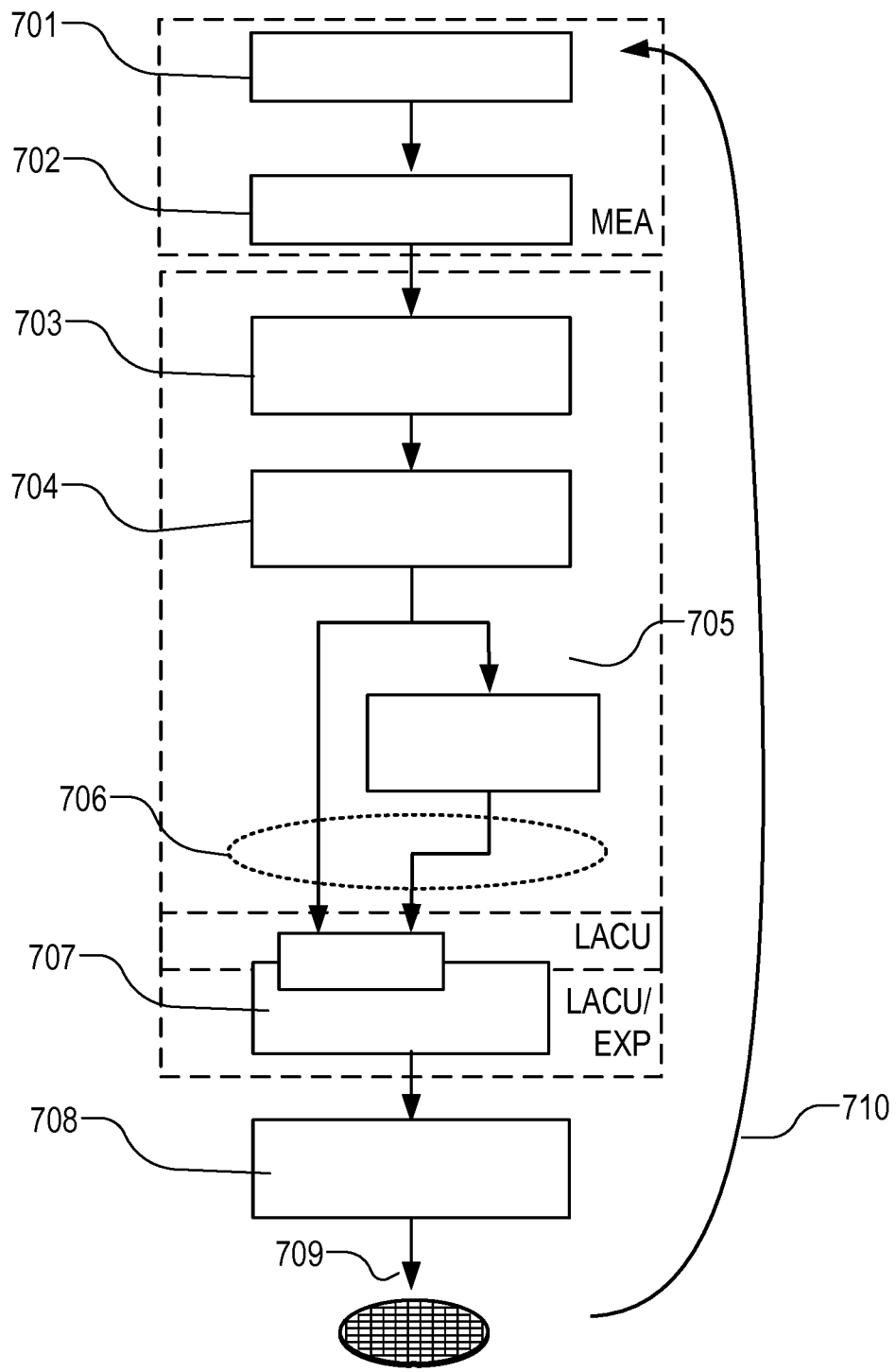
FIG. 7 is a flowchart of a method of manufacturing a device according to a second embodiment of the present invention.

FIG. 7 illustrates an alternative example in which the identification of height anomalies is explained. Information on the nature and location of height anomalies is used to influence the manner in which the height map is used to control focus, as an alternative to or in addition to modifying the height map itself. The process in FIG. 7 comprises steps 701 to 710 which correspond very closely to the steps 601 to 610 illustrated in FIG. 6. These steps will not be described again in detail. The aim again is to use knowledge of identified height anomalies to reduce the influence of the height anomalies in controlling imaging operations to apply the pattern to the substrate. In the prior example (FIG. 6), this is done by modifying the height map data to eliminate or reduce the height anomalies, and then using the modified height map in the conventional focus control process. In the FIG. 7 example, at step 706 the (possibly unmodified) height map is delivered to the lithographic apparatus control unit LACU together with separate data identifying locations and/or other properties of regions where a height anomaly has been detected. This separate data may be referred to as an "anomaly map", without limitation as to any particular form of expression of the data. A modified focus control function 707 controls the exposure station of the lithographic apparatus to control focusing based on the height map data, while using the anomaly map to reduce the influence of the height map data in the identified height anomaly regions.

As mentioned, the form of the anomaly map can be freely chosen. As a simple example, a binary mask M(x,y) may be created. The mask is an array of pixel values or other function of location (x, y), whose value determines how much weight is given to height map data h(x,y) at that location in calculating the optimum focus. So, for example, mask M(x,y) may be a simple binary function so that a '0' will cause a corresponding height map entry to be ignored by the focus control. In this way, the prior knowledge encoded in function M(x,y) can be used to identify height values that are in a height anomaly region. The modified focus control step 707 ensures that these measurements are ignored in the averaging process, thereby avoiding disturbance of the aerial image by local height anomalies. Instead of a simple binary mask, a graduated weighting function could be provided. In that case, the influence of the height anomaly on the imaging may be reduced, without being eliminated entirely.

It may be an advantage of the FIG. 6 method, that the focus control process 607, which is a critical real-time process in any lithographic apparatus, is not disturbed, and improved focus is achieved by prior processing of the height map. On the other hand, the method of FIG. 7 may allow more direct optimization of the focus, taking into account other factors if desired. If desired, both types of process can be used together, either in the same exposure, or when exposing different layers on the same substrate.

Figure 8:
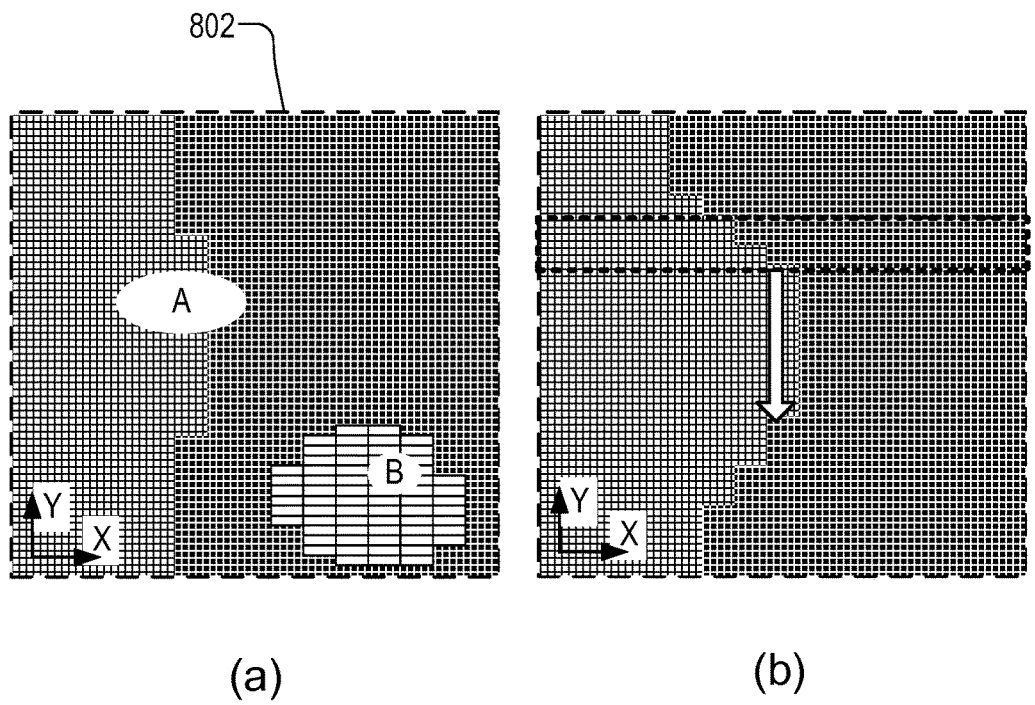
FIG. 8 illustrates schematically (a) a height map showing a height anomaly and (b) a resulting focus height profile in a lithographic apparatus operating according to an embodiment of the present invention.
Figure 9:
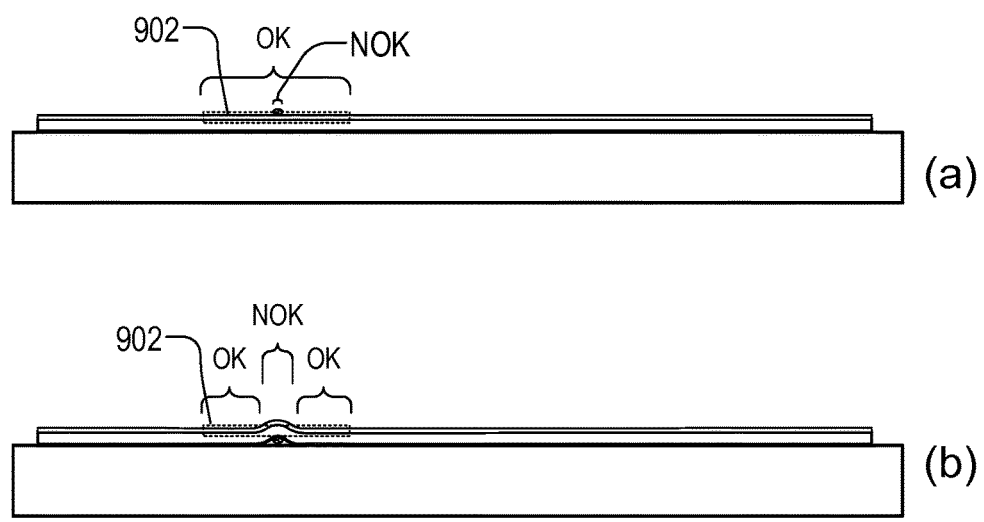
FIG. 9 illustrates in side view the influence of height anomalies on focusing performance in the apparatus operating according to an embodiment of the present invention, in the case of (a) contamination on the substrate and (b) contamination beneath the substrate.

Whatever method is used, FIGS. 8 and 9 illustrate the improved imaging performance of the apparatus and methods disclosed herein, relative to the conventional methods seen in FIGS. 4 and 5. In FIG. 8(a), the modified height map 802 is shown, corresponding to the height map of FIG. 4(a) but with the height values in identified height anomaly region B removed. In FIG. 8(b) we see the focus height profile that is achieved when the height values in the height anomaly region are ignored (or replaced). In FIG. 9, we see that the aerial image 902 achieved using the modified height map and/or the height map and anomaly map, is not disturbed so much by the presence of the height anomaly (contamination). Just as in FIG. 5, poor focusing, and consequently poor formation of the pattern in the resist material, is represented by the region labeled NOK, in contrast to the normal performance location labeled OK and shown at the right hand side. Even though in the immediate vicinity of the contamination the focusing may be disturbed (NOK), the regions in which imaging is successfully achieved represent a greater portion of the field area than using the known technique. In practical and commercial terms, a greater proportion of the devices on the substrate will be formed with satisfactory performance. Particularly in the case where the field contains a number of smaller device areas, this improvement may result in a greater yield of functional devices at the end of the manufacturing process.

Figure 10:
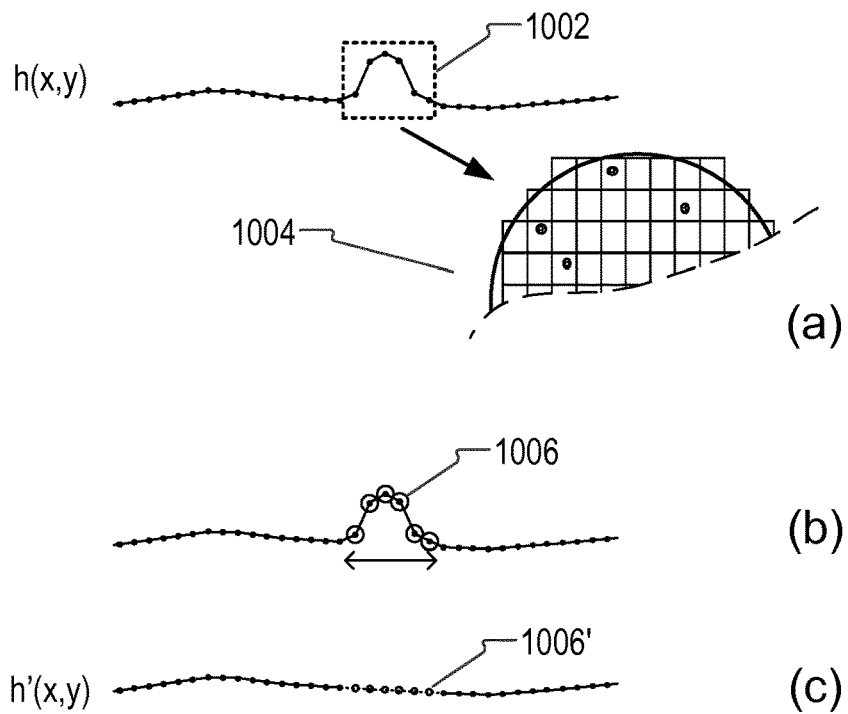
FIG. 10 illustrates steps in a first example method of disregarding a height anomaly.
Figure 11:
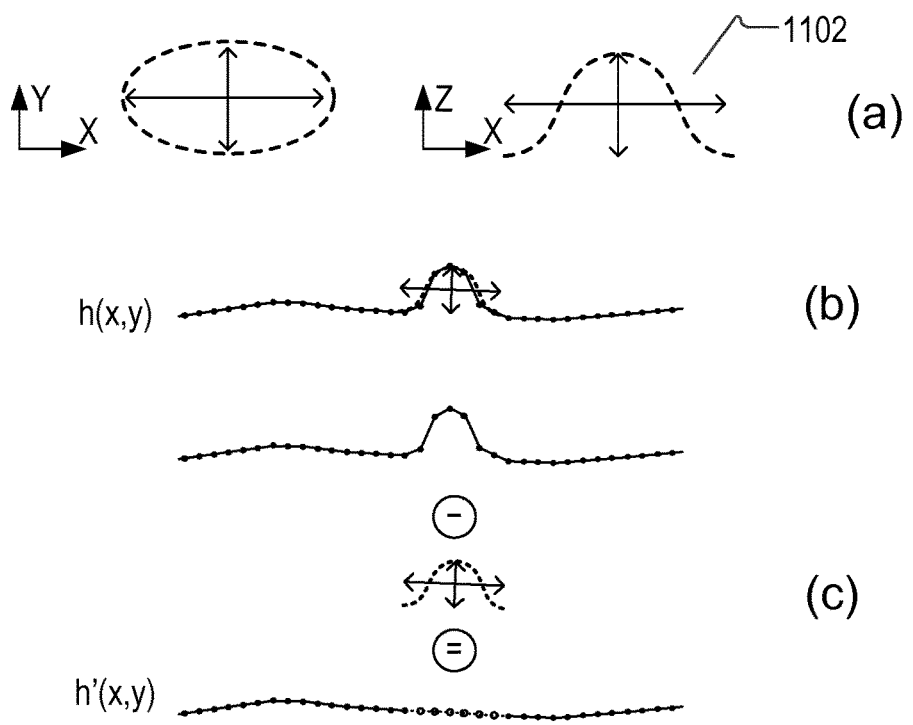
FIG. 11 illustrates steps in a second example method of disregarding a height anomaly.

FIGS. 10 and 11 illustrate in detail processing of height values to discard height anomalies. In FIG. 10(a) a one-dimensional slice of two dimensional height map h(x,y) is shown, comprising a series of height value samples, to which a curve has been fitted for the sake of illustration only. By high-pass filtering and/or pattern recognition a height anomaly is identified in region 1002. A portion of an anomaly map 1004 is illustrated, in which dark patches indicate the identified height anomaly regions. At FIG. 10(b) we see the height map data with the height values identified via circles, which are within height anomaly regions (pixels) 1006. These are the ones that are to be discarded. At (c) we see an example of modified height map data h'(x,y) in which new height values 1006' have been interpolated from the surrounding samples. Interpolation may be by any suitable technique, for example linear interpolation, bicubic interpolation etc.

The precise method of filtering to identify height anomalies is a matter of design choice. A 2-D low pass filter can be used. Alternatively, height anomaly may be defined to include any sample (pixel) which exceeds the height of pixels in a closely surrounding region by a predetermined amount. In FIG. 11 a more sophisticated approach is applied to obtain a modified height map. Firstly, as illustrated at (a), a mathematical model 1102 of an expected height anomaly is defined which may have a fixed size, or size defined by parameters such as height, extent in X and extent in Y (a single extent value may be sufficient as typical focus spots have similar extent in both X and Y). Then at (b) pattern matching is applied, fitting one or more instances of the anomaly model to height anomalies found in height map h(x,y). In the case where the anomaly model has one or more variable parameters, these parameters are adjusted to make best fit of the observed height anomaly at each location. Then at (c), instead of simply discarding height values in the anomaly, the fitted anomaly model is subtracted from the measured height values to obtain modified height map h'(x,y). The processing in this example is more complicated than in the example of FIG. 10. On the other hand, assuming that height anomalies have a well-defined and predictable form, the method of FIG. 11 has the benefit of preserving as much as possible underlying height information. That is to say, the values that are modified in the modified height map are not merely interpolated from neighboring pixels, but retain in theory some information from the measurement(s) taken within the anomaly region.

The identified anomaly region can also be used to correct an overlay map. An overlay map comprises for example a two-dimensional vector plot wherein each vector indicates the overlay size and direction, i.e. the misalignment size and direction between two patterned layers. The height anomaly may have an influence on the measured overlay at that location. For example, in the case that in a first layer no height anomaly is identified and in a subsequent layer a height anomaly is identified, the measured overlay may exhibit an overlay anomaly region at the location of the height anomaly in which region the overlay vectors (values) deviate from the surrounding overlay vectors mainly in size. In the same way as described above, the overlay map with the overlay anomaly region can be modified, for example by at least partially ignoring an overlay anomaly, by replacing the measured overlay (values or vectors) in the overlay anomaly region by the overlay measured at a location adjacent to or neighboring the overlay anomaly region, by subtracting a modeled height anomaly from overlay values and/or vectors in the overlay map, or by using different, e.g. reduced, weighting (factors) for the measured overlay (values or vectors) in the overlay anomaly region. Similarly other parameter maps may include such an anomaly region that corresponds to the height anomaly region, for example a map of critical dimension (CD) values, and these parameter maps may be modified in similar ways as described above.

In each of the described methods, the techniques for focus spot monitoring described in the prior patent application EP 1457828 A2 can be applied to improve the reliability and accuracy of detection. That is to say, one option to improve accuracy is to calculate an average die topography from the height map, and subtract this from the height map, as a preliminary step in the identification of height anomalies. The benefit of this is that, in the event that the product itself has localized height anomalies due to the layout and processing of functional device features in previous processing steps, these can be disregarded to avoid falsely identifying them as focus spots caused by contamination or the like.

Similarly, any of the techniques of the prior publications mentioned in the introduction can be applied to improve level sensing performance and imaging performance, in addition to the techniques disclosed herein. For example, the technique of US 2013128247 A can be used to eliminate anomalous measurement samples before the height map is calculated.

In conclusion, the present disclosure provides methods enabling improved focusing and improved patterning performance, during the lithographic manufacturing process. The present method reduces the influence of height anomalies, such as those caused by contamination above and/or below the substrate. Furthermore, the novel method requires no change in the hardware of a lithography system and does not require any input data measurements other than those conventionally provided as part of the lithographic manufacturing process. The method may include generating more accurate height maps (meaning simply height maps modified to achieve more optimal focusing of critical features), and/or to modify the way height map data is used in the actual focus control process.

In an embodiment, there is provided a lithographic apparatus for imaging a pattern onto a substrate using an optical projection system, the apparatus being arranged to obtain a height map representing a topographical variation across the substrate and the apparatus comprising a controller arranged to use the height map in controlling imaging of the pattern onto the substrate, wherein the apparatus is further arranged to ignore at least partially a height anomaly represented in a localized region of the height map when controlling the imaging.

In an embodiment, the apparatus is arranged to identify the height anomaly from the obtained height map. In an embodiment, the apparatus is arranged to identify the height anomaly by a shape recognition model. In an embodiment, the apparatus is arranged to produce a modified version of the height map in which the height anomaly is at least partially removed, and to use the modified version of the height map in controlling imaging of the pattern on the substrate. In an embodiment, the apparatus is arranged to produce a modified version of the height map in which height values in a height anomaly region are replaced by values derived from height values at locations neighboring the height anomaly region. In an embodiment, the apparatus is arranged to produce a modified version of the height map in which a modeled height anomaly is subtracted from height values in the height anomaly region. In an embodiment, the apparatus is arranged to produce a modified version of the height map in which a reduced weighting is applied to height values in the height anomaly region. In an embodiment, the apparatus is arranged to supply to the controller anomaly map data that specifies locations of the identified height anomaly, and the controller is arranged to use the anomaly data together with the height map data in controlling imaging of the pattern on the substrate while reducing the influence of height map data at the specified locations. In an embodiment, the lithographic apparatus further comprises a level sensing arrangement arranged to obtain the height map by measuring the substrate after the substrate has been loaded into the lithographic apparatus.

In an embodiment, there is provided a method of controlling imaging of a pattern on a substrate, the method comprising: obtaining a height map of the substrate; and using the height map to control the imaging of the pattern to the substrate, while at least partially ignoring a height anomaly represented in the obtained height map. In an embodiment, using the height map comprises producing a modified version of the height map in which a representation of the height anomaly is at least partially removed, and using the modified version of the height map in controlling the imaging. In an embodiment, using the height map comprises producing a modified version of the height map in which height values in a height anomaly region of the height map are replaced by values derived from height values at locations neighboring the height anomaly region. In an embodiment, using the height map comprises producing a modified version of the height map in which a modeled height anomaly is subtracted from height values in the height map. In an embodiment, using the height map comprises producing a modified version of the height map in which a reduced weighting is applied to height values in the height anomaly region. In an embodiment, using the height map comprises producing anomaly map data specifying locations of the identified height anomaly, and using the anomaly map data together with the height map to control imaging of the pattern on the substrate so as to reduce the influence of the height map at the specified locations. In an embodiment, the method further comprises producing an overlay map and using the height map and the identified height anomaly region to identify an overlay anomaly region, and producing a modified version of the overlay map by any one of the following steps: at least partially ignoring an overlay anomaly, or replacing overlay values or vectors in the overlay anomaly region of the overlay map by values or vectors derived from overlay values or vectors at locations neighboring the overlay anomaly region, or subtracting a modeled height anomaly from overlay values or vectors in the overlay map, or applying a reduced weighting to overlay values or vectors in the overlay anomaly region.

In an embodiment, there is provided a computer program product comprising machine-readable instructions for causing a lithographic apparatus to implement a method as described herein.

In an embodiment, there is provided a lithographic apparatus for imaging a pattern onto a substrate using an optical projection system, the apparatus including: a level sensor operable, prior to applying the pattern, to obtain measurement signals related to a height of the substrate surface at many locations across the substrate; a processor arranged to use the measurement signals to derive data representing a height map of the substrate; and a controller arranged to use the height map data to control focusing of the projection system when applying the pattern to the substrate at one or more target locations, wherein the processor and controller are further arranged to use the measurement signals directly or indirectly to identify a height anomaly on the substrate surface, and to disregard at least partially the height anomaly when controlling focusing of the projection system.

An embodiment of the invention may be implemented using a computer program containing one or more sequences of machine-readable instructions describing methods of controlling the lithographic apparatus using height map data as described above. This computer program may be executed for example within the control unit LACU of FIG. 2, or some other processor or controller. There may also be provided a non-transient data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A lithographic apparatus configured to image a pattern via an aerial image field onto a substrate using an optical projection system, the apparatus arranged to obtain a height map representing a topographical variation across the substrate and the apparatus comprising a control system programmed to at least;
   obtain a recognized height anomaly in a localized region of the height map, the localized region corresponding to at least part of the aerial image field;
   use the height map in controlling imaging of the pattern onto the substrate, and
   when controlling the imaging in at least part of the aerial image field using the height map, exclude from use a value of, or use a different value for, the height anomaly represented in the localized region of the height map corresponding to at least part of the aerial image field of the imaging being controlled.

2. A lithographic apparatus as claimed in claim 1, wherein the apparatus is arranged to identify the height anomaly from the obtained height map.

3. A lithographic apparatus as claimed in claim 1, wherein the apparatus is arranged to identify the height anomaly by a shape recognition model.

4. A lithographic apparatus as claimed in claim 1, wherein the apparatus is arranged to produce a modified version of the height map in which the height anomaly is at least partially removed, and to use the modified version of the height map in controlling imaging of the pattern on the substrate.

5. A lithographic apparatus as claimed in claim 1, wherein the apparatus is arranged to produce a modified version of the height map in which height values in a height anomaly region are replaced by values derived from height values at locations neighboring the height anomaly region.

6. A lithographic apparatus as claimed in claim 1, wherein the apparatus is arranged to produce a modified version of the height map in which a modeled height anomaly is subtracted from height values in a height anomaly region.

7. A lithographic apparatus as claimed in claim 1, wherein the apparatus is arranged to produce a modified version of the height map in which a reduced weighting is applied to height values in a height anomaly region.

8. A lithographic apparatus as claimed in claim 1, wherein the apparatus is arranged to supply to the controller anomaly map data that specifies a location of the recognized height anomaly, and the controller is arranged to use the anomaly data together with the height map data in controlling imaging of the pattern on the substrate while reducing the influence of height map data at the specified location.

9. A lithographic apparatus as claimed in claim 1, further comprising a level sensing arrangement arranged to obtain the height map by measuring the substrate after the substrate has been loaded into the lithographic apparatus.

10. A method of controlling imaging of a pattern via an aerial image field onto a substrate, the method comprising:
    obtaining a height map of the substrate;
    obtaining a recognized height anomaly in a region of the height map, the localized region corresponding to at least part of an aerial image field; and
    using the height map to control the imaging, in at least part of the aerial image field, of the pattern to the substrate, while excluding from use a value of, or using a different value for, the height anomaly represented in the region of the obtained height map corresponding to at least part of the aerial image of the imaging being controlled.

11. A method as claimed in claim 10, wherein using the height map comprises producing a modified version of the height map in which a representation of the height anomaly is at least partially removed, and using the modified version of the height map in controlling the imaging.

12. A method as claimed in claim 10, wherein using the height map comprises producing a modified version of the height map in which height values in a height anomaly region of the height map are replaced by values derived from height values at locations neighboring the height anomaly region.

13. A method as claimed in claim 10, wherein using the height map comprises producing a modified version of the height map in which a modeled height anomaly is subtracted from height values in the height map.

14. A method as claimed in claim 10 wherein using the height map comprises producing a modified version of the height map in which a reduced weighting is applied to height values in a height anomaly region.

15. A method as claimed in claim 10, wherein using the height map comprises producing anomaly map data specifying a location of the recognized height anomaly, and using the anomaly map data together with the height map to control imaging of the pattern on the substrate so as to reduce the influence of the height map at the specified location.

16. A method as claimed in claim 10, further comprising producing an overlay map and using the height map and a height anomaly region to identify an overlay anomaly region, and producing a modified version of the overlay map by any selected from:
    at least partially ignoring an overlay anomaly, or
    replacing overlay values or vectors in the overlay anomaly region of the overlay map by values or vectors derived from overlay values or vectors at locations neighboring the overlay anomaly region, or
    subtracting a modeled height anomaly from overlay values or vectors in the overlay map, or
    applying a reduced weighting to overlay values or vectors in the overlay anomaly region.

17. A non-transitory computer program product comprising machine-readable instructions, that when executed, are configured to cause a computer system to at least:
    obtain a height map of a substrate;
    obtain a recognized height anomaly in a region of the height map, the localized region corresponding to at least part of an aerial image field; and
    use the height map to control imaging by a lithographic apparatus of a pattern via the aerial image field to the substrate, while excluding from use a value of, or using a different value for, the height anomaly represented in the region of the obtained height map corresponding to at least part of the aerial image of the imaging being controlled.

18. A lithographic apparatus configured to image a pattern via an aerial image field onto a substrate using an optical projection system, the apparatus including:
    a level sensor operable, prior to applying the pattern, to obtain measurement signals related to a height of the substrate surface at locations across the substrate;
    a processor configured to use the measurement signals to derive data representing a height map of the substrate; and
    a controller configured to use the height map data to control relative positioning between an optical focus of the projection system and the substrate when applying the pattern to the substrate at one or more target locations,
    wherein the processor and controller are further configured to use the measurement signals directly or indirectly to identify a height anomaly on the substrate surface, and to exclude from use a value of, or use a different value for, the identified height anomaly corresponding to at least part of the aerial image field when controlling the relative positioning for applying the pattern to the substrate via the aerial image field.

19. A lithographic apparatus as claimed in claim 1, wherein the apparatus is further configured to:
    produce an overlay map;
    use the height map and a height anomaly region to identify an overlay anomaly region; and
    produce a modified version of the overlay map by any one selected from:
    at least partially ignoring an overlay anomaly, or replacing overlay values or vectors in the overlay anomaly region of the overlay map by values or vectors derived from overlay values or vectors at locations neighboring the overlay anomaly region, or
    subtracting a modeled height anomaly from overlay values or vectors in the overlay map, or
    applying a reduced weighting to overlay values or vectors in the overlay anomaly region.

20. A computer program product as claimed in claim 17, wherein the instructions are further configured to cause the computer to:
    produce an overlay map;
    use the height map and a height anomaly region to identify an overlay anomaly region; and
    produce a modified version of the overlay map by any selected from:
    at least partially ignoring an overlay anomaly, or
    replacing overlay values or vectors in the overlay anomaly region of the overlay map by values or vectors derived from overlay values or vectors at locations neighboring the overlay anomaly region, or
    subtracting a modeled height anomaly from overlay values or vectors in the overlay map, or
    applying a reduced weighting to overlay values or vectors in the overlay anomaly region.

* * * * *